(12) United States Patent
Wu et al.

(10) Patent No.: US 7,605,460 B1
(45) Date of Patent: Oct. 20, 2009

(54) METHOD AND APPARATUS FOR A POWER DISTRIBUTION SYSTEM

(75) Inventors: Paul Ying-Fung Wu, Saratoga, CA (US); Soon-Shin Chee, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 79 days.

(21) Appl. No.: 12/028,434

(22) Filed: Feb. 8, 2008

(51) Int. Cl.
H01L 23/52 (2006.01)

(52) U.S. Cl. .................. 257/691; 257/762; 257/700; 438/652

(58) Field of Classification Search ............. 257/700, 257/691, 698, 701, 762; 438/125, 455, 622, 438/624, 652
See application file for complete search history.

(56) References Cited

U.S. PATENT DOCUMENTS

| | | |
|---|---|---|
| 5,222,014 A | 6/1993 | Lin |
| 6,319,829 B1 | 11/2001 | Pasco et al. |
| 6,583,502 B2 | 6/2003 | Lee et al. |
| 6,618,938 B1 | 9/2003 | Alagaratnam et al. |
| 6,708,404 B1 * | 3/2004 | Gaku et al. .............. 29/852 |
| 6,734,552 B2 | 5/2004 | Combs et al. |
| 6,970,362 B1 | 11/2005 | Chakravorty |
| 6,979,895 B2 | 12/2005 | Akram et al. |
| 2002/0195100 A1 | 12/2002 | Webb |
| 2002/0195700 A1 | 12/2002 | Li |
| 2004/0022038 A1 | 2/2004 | Figueroa |
| 2005/0127489 A1 | 6/2005 | Mallik et al. |
| 2006/0158863 A1 | 7/2006 | Hsu |
| 2007/0108583 A1 | 5/2007 | Shim et al. |
| 2009/0129037 A1 * | 5/2009 | Yoshino ............ 361/761 |
| 2009/0145766 A1 * | 6/2009 | Takai et al. ............ 205/112 |
| 2009/0154132 A1 * | 6/2009 | Okamoto et al. ............ 361/804 |

OTHER PUBLICATIONS

U.S. Appl. No. 11/511,833, filed Aug. 29, 2006, Wu et al.
U.S. Appl. No. 11/511,969, filed Aug. 29, 2006, Hoang et al.

\* cited by examiner

*Primary Examiner*—S. V Clark
(74) *Attorney, Agent, or Firm*—Michael T. Wallace (57) ABSTRACT

A method and apparatus is provided to reduce the spreading inductance and increase the distributed capacitance of power planes within the power distribution system of a semiconductor package substrate. In one embodiment, pre-fabricated copper-clad laminate (CCL) structures are utilized as starting material for the power plane pairs, which are then integrated into a package substrate using imaging, lamination, and drilling/plating processes. In alternate embodiments, a starting material having a larger insulating layer thickness may be used to form the CCL structure, whereby a pair of metallic planes having a perforated mesh pattern are adjoined through a dielectric layer to create an effective separation distance between the metallic planes. Alternate embodiments employ plating or deposition methods to obtain a minimum separation distance between the metallic planes of a power plane pair.

20 Claims, 6 Drawing Sheets

METHOD AND APPARATUS FOR A POWER DISTRIBUTION SYSTEM

FIELD OF THE INVENTION

The present invention generally relates to power distribution systems, and more particularly to power distribution systems implemented within a package substrate.

BACKGROUND OF THE INVENTION

System-in-package (SIP) is an integration approach that is often utilized to achieve intelligent partitioning of the key components of an electronics system to achieve increased functionality using smaller form factors. One implementation of SIP technology applies three-dimensional integration, whereby one or more semiconductor die are stacked on top of a package substrate so as to increase the amount of circuitry that may exist per unit area.

Die stacking involves a process whereby a base die, such as a field programmable gate array (FPGA) for example, is attached to a package substrate to form a device package. The base die may also provide a platform for one or more stacked die, such as random access memory (RAM) or a microprocessor. Interconnections between the base die, the package substrate, and the one or more stacked die may be implemented using a plurality of implementations, such as using micro-bumps, solder bumps, solder balls, wire bonds, build-up vias, plated-through holes (PTHs), and associated through die vias (TDVs).

The inter-die signal path connections may be facilitated through the use of programmable heterogeneous integration (PHI) tiles. In general, a PHI tile consists of programmable multiplexers, TDVs, level translation circuits, test circuits, and dedicated power supply ports. A PHI tile is used to interconnect a base die having specific patterns of TDVs and associated input/output (I/O) pads with one or more stacked die having I/O pads that match the I/O pad placements of the base die. Logic signals existing within the stacked die may then be propagated to the base die using the associated TDVs, I/O pads, and level translation circuitry as may be required in a particular application.

Inter-die signal path connections may also be formed between the base die, the stacked die, and the package substrate to supply the one or more die with operational power. In particular, the package substrate may act as a power distribution system that may be comprised of multiple conductive layers, whereby pairs of conductive layers are arranged as power/ground plane pairs. Each power/ground plane pair of the package substrate is separated by a dielectric material, which acts as an insulative layer between the power/ground plane pair.

Figure 1:
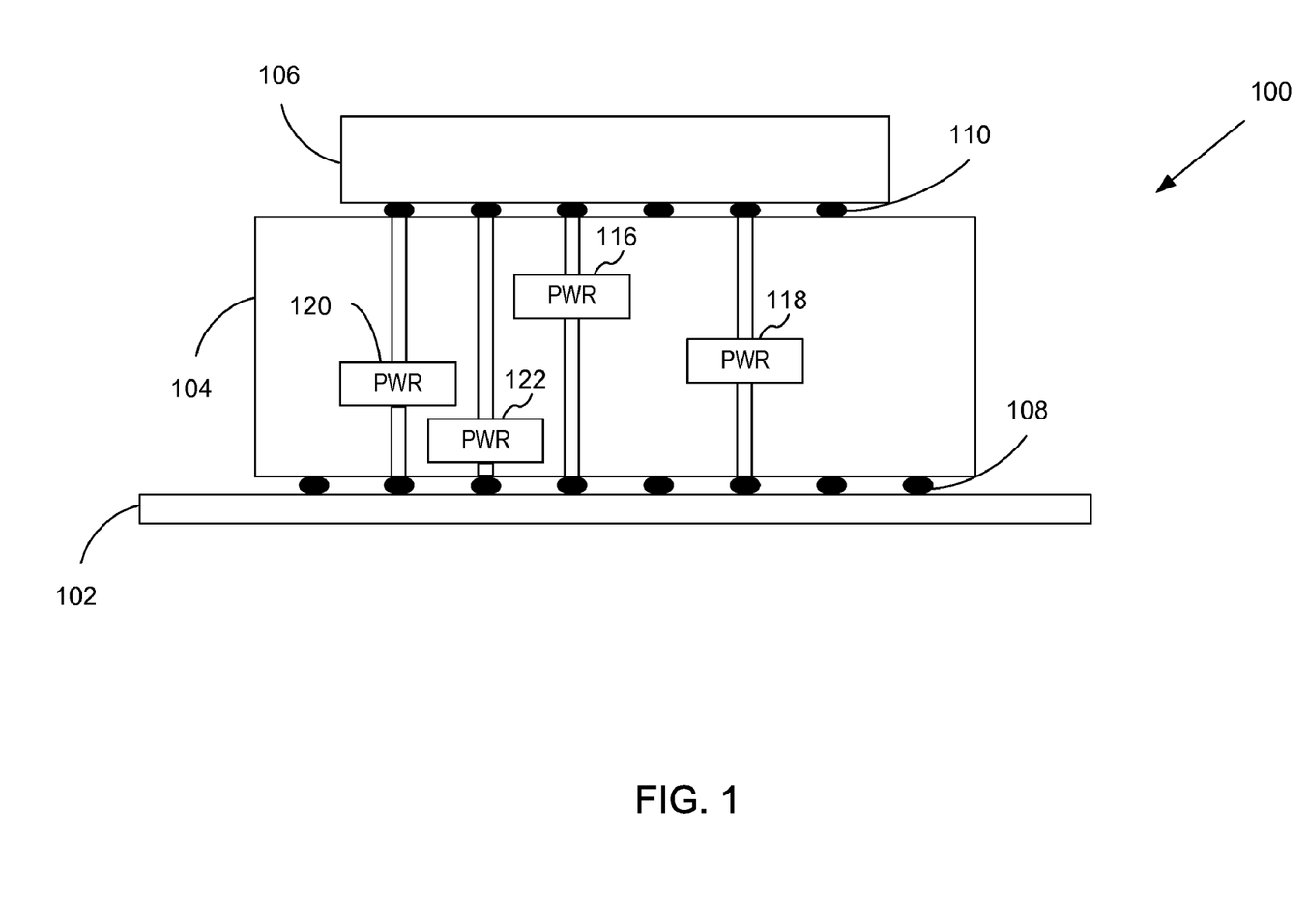
FIG. 1 illustrates a cross-section view of a semiconductor die package.

Turning to FIG. 1, a cross-section of exemplary die package 100 is shown, whereby one or more flip-chip die 106 may be coupled to package substrate 104 using, e.g., solder bump interconnection. In particular, the active side of die 106 contains an array of pads upon which solder bumps 110 are attached. Package substrate 104 similarly contains a corresponding array of pads, which electrically combine with solder bumps 110 to form the interconnection between die 106 and package substrate 104. Package substrate 104 also contains an array of pads upon which solder balls 108 are attached, so as to accommodate the interconnection between package substrate 104 and circuit board 102.

Power planes 120,122 and 116,118 may exist within the core of package substrate 104, or conversely, may exist within the build-up layers of package substrate 104, as power plane pairs. In particular, power plane 122 may provide a reference potential, e.g., ground potential, and power plane 120 may provide an operational potential that is referenced to the potential of ground plane 122. Similarly, power plane 118 may provide a reference potential, e.g., ground potential, and power plane 116 may provide an operational potential that is referenced to the potential of ground plane 118. Each operational and reference potential is then provided to die 106, via circuit board 102, using a plurality of plated-through holes (PTHs) that are implemented within the core of package substrate 104, combined with build-up vias, or laser vias, that are implemented within the build-up layers of package substrate 104.

Power planes 116-122 may comprise an entire conductive layer within the core of package substrate 104, or conversely, may be implemented as isolated "islands" of conductivity. In either instance, a characteristic impedance, $Z_0$, is associated with each power plane pair and associated interconnect that provides operational power to die 106 from circuit board 102. Assuming the power planes and interconnects are lossless, the characteristic impedance of the power distribution system may be defined as:

$$Z_0 = \sqrt{\frac{L}{C}}, \quad (1)$$

where L is the spreading inductance and C is the distributed capacitance of a particular power plane pair and associated interconnect. While the power distribution system is assumed to be lossless for purposes of analysis, typical power distribution systems often exhibit lossy characteristics, so as to dampen, or dissipate, resonance energy that may be created during high speed switching operations within die 106.

As can be verified from equation (1), minimization of the characteristic impedance of the power distribution system may be accomplished by: decreasing the spreading inductance L; increasing the distributed capacitance C; or a combination of both. The magnitude of spreading inductance exhibited by a power plane pair within a package substrate is directly proportional to the thickness of the dielectric layer that separates the operational power plane from the reference power plane. Thus, the spreading inductance increases as the thickness of the dielectric layer increases.

The distributed capacitance magnitude, on the other hand, is inversely proportional to the thickness of the dielectric layer that separates the operational power plane from the reference power plane. Thus, the distributed capacitance decreases as the thickness of the dielectric layer increases. It can be seen, therefore, that by decreasing the thickness of the dielectric layer, the spreading inductance may be decreased and the distributed capacitance may be increased, which decreases the overall impedance of the power distribution system in accordance with equation (1).

Conventional power distribution systems, however, utilize power plane pairs that are separated by dielectric layers having thicknesses between 35 μm and 100 μm. As such, the spreading inductance of the power plane pair is increased above a desirable limit and the distributed capacitance of the power plane pair is decreased below a desirable limit, which increases the overall impedance of the power distribution system beyond desirable limits.

Figure 2:
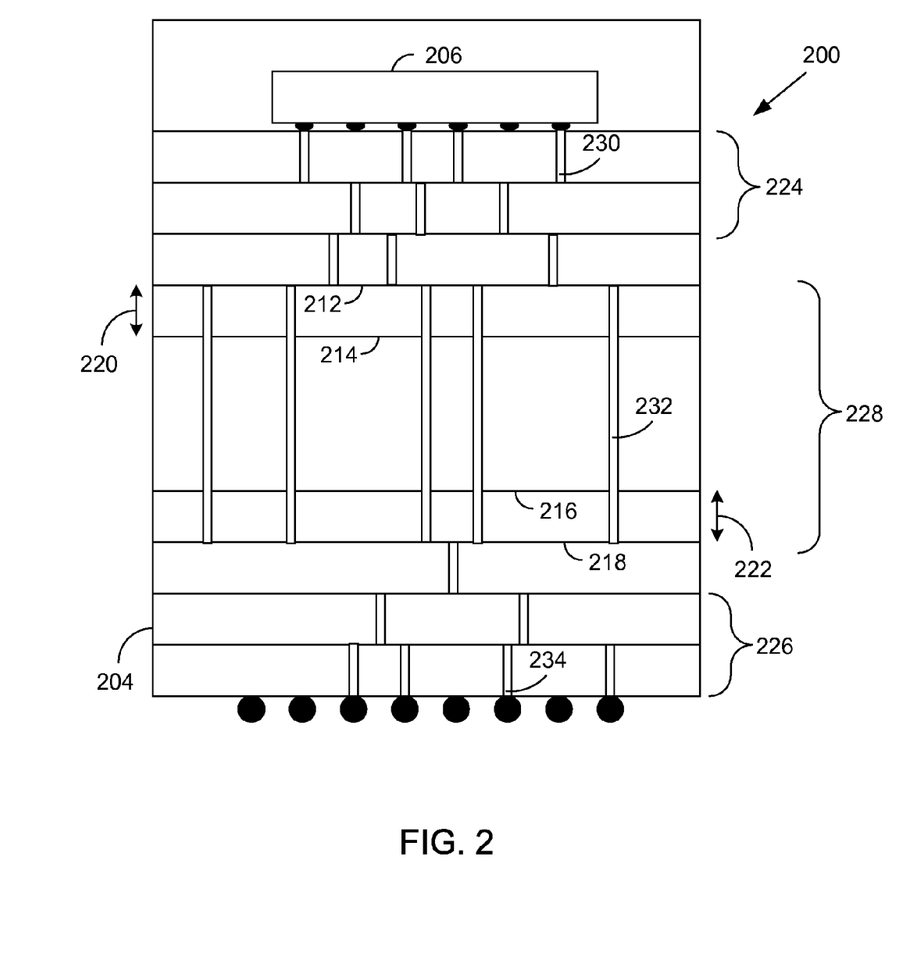
FIG. 2 illustrates the conductive layers of the power distribution system contained within the semiconductor die package of FIG. 1.

Turning to FIG. 2, for example, a cross-section of conventional 3+4+3 power distribution system 200 is illustrated. The "3+4+3" convention used in the illustrated power distribution system of FIG. 2 denotes that 3 conductive layers are utilized within build-up portion 224, 4 conductive layers are utilized within core portion 228, and 3 conductive layers are utilized within build-up portion 226 of package substrate 204. Conductive layers within build-up portions 224 and 226 are interconnected using build-up vias 230 and 234, which are also known as laser vias. Build-up vias 230 and 234 may be offset from one another as illustrated, or conversely, may be aligned vertically to create stacked, build-up vias that exhibit similar effects of a plated-through hole due to their alignment in the X-Y plane. Interconnections within core portion 228 are generally implemented using PTHs 232, whereby PTHs 232 may be isolated from a particular conductive plane within core portion 228, or conversely, may be electrically coupled to a particular conductive plane within core portion 228.

Generally, power plane pairs 212,214 and 216,218 exist within core portion 228 to implement a power distribution system for die 206. In particular, package substrate 204 provides power plane pairs 212,214 and 216,218, which may be separated by a dielectric layer having thickness 220 and 222, respectively. The spreading inductance exhibited by power plane pairs 212,214 and 216,218 having a dielectric layer thickness of 35 μm, for example, is approximately equal to 45 pico henries per square. The distributed capacitance of such an arrangement is approximately equal to 112 pF/cm$^2$. A 100 μm dielectric layer displaced between the power plane pairs, on the other hand, exhibits approximately 130 pico henries per square of spreading inductance and approximately 35 pF/cm$^2$ of distributed capacitance.

Maximization of the distributed capacitance allows the power distribution system to maximize the ability to respond to dynamic current demands that are imposed by die 206. Similarly, minimization of the spreading inductance minimizes the reluctance of the power distribution system to retard changes in current flow. As discussed above, however, conventional power plane pairs exhibit relatively thicker dielectric layers, which increases the overall impedance of the power distribution system, thereby limiting the power distribution system's performance during dynamic current demands imposed by die 206. Given that additional die are stacked upon die 206 to form a stacked die package, the dynamic current demands that are imposed upon the power distribution system are even greater.

What is needed, therefore, is a power distribution system that both maximizes the distributed capacitances and minimizes the spreading inductance so as to optimize current flow for enhanced noise performance of a package substrate within, for example, a SIP based integration.

SUMMARY OF THE INVENTION

To overcome limitations in the prior art, and to overcome other limitations that will become apparent upon reading and understanding the present specification, various embodiments of the present invention disclose a method and apparatus to reduce the spreading inductance and increase the distributed capacitance of power plane pairs so as to optimize current flow for enhanced noise performance of a package substrate power distribution system.

In accordance with one embodiment of the invention, a power distribution system comprises a package substrate that includes a plurality of conductive layers that are separated by a plurality of insulating layers, where each of the plurality of insulating layers has a first thickness. The package substrate further includes a plurality of copper-clad laminate structures, where each copper-clad laminate structure includes conductive layers that are separated by an insulating layer having a second thickness. The power distribution system further comprises a die that is coupled to the package substrate and is adapted to conduct operational power from the plurality of copper-clad laminate structures. The second thickness is less than one half of the first thickness.

In accordance with another embodiment of the invention, a power distribution system comprises a package substrate that includes a plurality of conductive layers that are separated by a plurality of insulating layers, where each of the plurality of insulating layers has a first thickness. The package substrate further includes a plurality of copper-clad laminate structures, where each copper-clad laminate structure includes first and second conductive layers having first and second perforation patterns, where the first and second conductive layers are separated by an insulating layer having a second thickness. The power distribution system further comprises a die that is coupled to the package substrate and is adapted to conduct operational power from the plurality of copper-clad laminate structures. The second thickness is less than one quarter of the first thickness.

In accordance with another embodiment of the invention, a method of forming a power distribution system within a package substrate comprises developing a starting material to form power plane pairs within the package substrate. The starting material includes first and second conductive layers that are separated by a first insulating layer. The method further comprises laminating the power plane pairs together to form a core portion of the package substrate, laminating build-up layers to the core portion to form build-up portions of the package substrate. The build-up portions include a plurality of conductive layers separated by a plurality of second insulating layers. A thickness of the first insulating layer is less than half of a thickness of the plurality of second insulating layers.

BRIEF DESCRIPTION OF THE DRAWINGS

Various aspects and advantages of the invention will become apparent upon review of the following detailed description and upon reference to the drawings in which.

DETAILED DESCRIPTION

Generally, various embodiments of the present invention are applied to the field of integrated circuits (ICs) of which programmable logic devices (PLDs) are a subset. In particular, a method and apparatus is provided to reduce the spreading inductance and increase the distributed capacitance of power planes within the power distribution system of a semiconductor package substrate. In one embodiment, a pre-fabricated, copper-clad laminate (CCL) structure is utilized as a starting material for the power plane pairs, which are then integrated into a package substrate using imaging, lamination, and drilling/plating processes.

The CCL implemented power plane pairs within the package substrate exhibit an insulating layer having thicknesses between, e.g., 1-15 micrometers (μm). Thus, the thickness of the dielectric layer of the CCL implemented power plane pairs are less than half of the insulating layer thicknesses of conventional power plane pairs, which range between 35-100 μm. As such, the spreading inductance and the distributed capacitance of the CCL implemented power plane pairs of the power distribution system combine to optimize current flow into the corresponding die of the semiconductor package, which subsequently reduces detrimental effects, such as ground bounce and power supply noise.

In an alternate embodiment, two metal planes and a dielectric layer may be used to form a starting material having a larger insulating layer thickness, e.g., 35 μm. The starting material may then be laminated together and then compressed using elevated pressure and increased heat to form a final CCL structure exhibiting an insulating layer thickness of, e.g., 5 μm. In particular, adjoining the two metal planes includes a lamination step, whereby a dielectric material is "sandwiched" between the two metal planes such that the original thickness of the dielectric material is compressed to a final thickness of, e.g., 5 μm. Such a reduced dielectric thickness is facilitated by the use of perforated mesh patterns formed in one, or both, of the two metal planes, whereby excess dielectric material is allowed to flow into the perforated mesh patterns of the first and/or second metal planes during the adjoining process. Non-conductive spacer posts inserted between the two metal planes prior to lamination define a minimum separation distance between the two metal planes after adjoinment. As such, an effective separation distance between the two metal planes is established that ultimately reduces the spreading inductance and increases the distributed capacitance of the final CCL structure.

Alternate embodiments employ plating or deposition processes to obtain a minimum separation distance between the two metallic planes of a power plane pair. For example, metallization of a non-conductive surface may be employed, whereby non-conductive elements, such as polymers, ceramics, and glass, may be sensitized and activated to accept conductive elements, such as nickel, aluminum, and copper, during a deposition process. Both surfaces of the non-conductive layer may then be plated through, e.g., a deposition process, to ultimately form the power plane pair, whereby the thickness of the non-conductive layer may be readily selected to, e.g., 1-15 μm.

Figure 3:
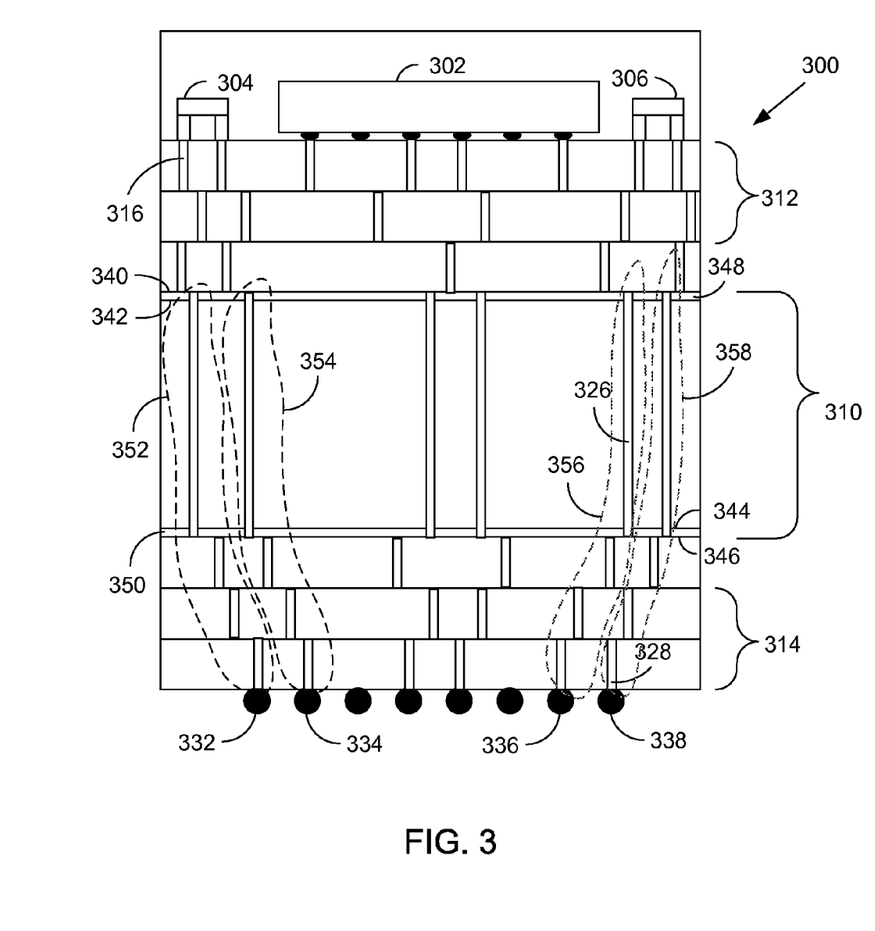
FIG. 3 illustrates an enhanced power distribution system within a semiconductor die package that exhibits reduced inductance and increased capacitance in accordance with an embodiment of the present invention.

Turning to FIG. 3, a power distribution system is illustrated within semiconductor die package 300, whereby CCL structures are utilized to form the power plane pairs within the package substrate. In particular, pre-fabricated CCL structures may be utilized as the starting material to form power plane pairs 340,342 and 344,346, where the dielectric layer thickness separating the power plane pairs is selected to be, e.g., 1-15 μm. By minimizing the thickness of the dielectric layer, power plane pairs 340,342 and 344,346 exhibit a spreading inductance that is decreased below the spreading inductance of conventional power plane pairs and a distributed capacitance that is increased above the distributed capacitance of conventional power plane pairs so as to decrease the overall impedance of the power distribution system to acceptable limits.

The package substrate of semiconductor die package 300 is arranged in layers, where for example, conductive/insulative layers form build-up portion 312 at the top of the package substrate, conductive/insulative layers form core 310 within the middle of the package substrate, and conductive/insulative layers form build-up portion 314 at the bottom of the package substrate. In one embodiment, power plane pair 340, 342 implements an operational power and ground plane pair within the core of the substrate package that is operating at a first relative voltage magnitude. Power plane pair 344,346 implements an additional operational power and ground plane pair within the core of the substrate package that is operating at a second relative voltage magnitude. It is noted, however, that more than two operational power and ground plane pairs may be implemented within core 310 depending upon the particular application. For example, a 3+6+3 configuration may be implemented, whereby 6 conductive layers within the core of the package substrate combine to form 3 power plane pairs. It is noted that still other configurations may be possible.

Each of the conductive/insulative layers of build-up portions 312 and 314 of the package substrate may be sequentially processed in a build-up processing sequence, whereby a sheet of conductive material, such as copper or aluminum, may be laminated onto both surfaces of an insulative layer, such as may be implemented using a prepreg material, to form a first "sandwich". Geometric patterns may then be defined by a microlithographic exposure process, whereby photoresist deposited on the conductive layers of the sandwich are exposed to geometric patterns of radiation, such as ultraviolet (UV) light, whereby the exposed areas are defined by an exposure tool, photomask, and/or computer data.

After exposure, the photoresist is subjected to a development process that converts the latent image in the photoresist into the final image, which ultimately serves as the mask in the subsequent etching process to selectively remove a portion of each conductive layer to produce the required geometric patterns in both conductive layers of the sandwich. Build-up vias 316 may then be formed within the sandwich and plated with a conductive material. Build-up vias 316 may additionally be coupled to one of the conductive layers of the sandwich, or conversely, may be electrically isolated from both conductive layers of the sandwich as required by the application. Additional sandwiches may be similarly processed and laminated together to produce build-up portions 312 and 314 of the package substrate, whereby the various geometric patterns of build-up portions 312 and 314 may be utilized to provide signal traces, build-up via isolation islands, build-up via coupling patterns, and any other geometric pattern that may be required for power and signal routing within the package substrate.

Turning to FIGS. 4A-4D, detailed aspects of the build-up process of the package substrate of FIG. 3 are illustrated. In step 452, the starting material that is used for power plane pairs 340,342 and 344,346 is developed. In one embodiment, as exemplified in FIG. 4A, a pre-fabricated copper-clad laminate (CCL) structure is utilized as a starting material for the power plane pair. In particular, the CCL structure of FIG. 4A may be pre-fabricated as a CCL structure, exhibiting conductive layers 402 and 404 that are separated by a dielectric, or insulative, material 406 whose thickness is between, e.g., 1 and 15 μm.

Figure 4A:
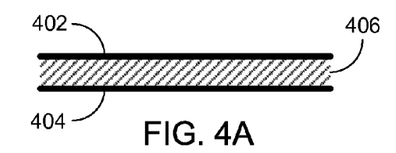
FIGS. 4A-4E illustrate a process sequence of forming the layers of the power distribution system of FIG. 3 in accordance with an embodiment of the present invention.
Figure 4B:
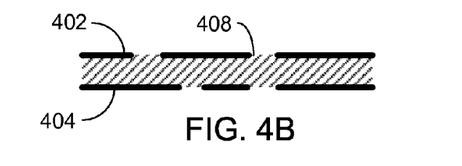

In step 454, geometric patterns 408 may be etched into conductive layers 402 and 404, as illustrated in FIG. 4B, using a microlithographic exposure process, whereby photoresist deposited on conductive layers 402 and 404 are exposed to geometric patterns of radiation. The photoresist is then subjected to a development process that converts the latent image in the photoresist into the final image, which ultimately serves as the mask in the subsequent etching process that is used to selectively remove portions of each conductive layer to produce the required geometric patterns 408 in both conductive layers 402 and 404 of the CCL starting material.

In step 456, power plane pairs are laminated to a dielectric, or insulating, layer 410 to form core portion 310 of the package substrate of FIG. 3. As exemplified in FIG. 4C, two power plane pairs 412 and 414 are laminated together. In other embodiments, however, other numbers, e.g., three, power plane pairs may be laminated to two insulating layers displaced between the three power plane pairs to form the core portion. In step 458, plated-through holes 416-422 are implemented within the core of FIG. 4C, whereby plated-through holes 416-422 either allow electrical coupling, or facilitate electrical isolation, from the top and bottom layers of core portion 310 to all conductive layers within core portion 310.

Figure 4C:
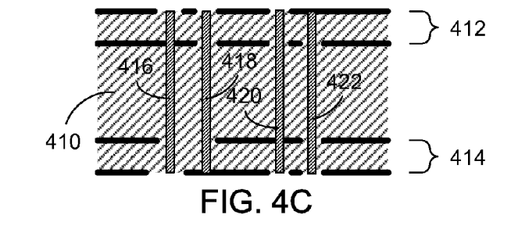

Plated-through hole 416, for example, provides connectivity to the bottom conductive layer of power plane pair 412 while being electrically isolated from the other conductive layers of power plane pairs 412 and 414. Plated-through hole 418, on the other hand, provides connectivity to the bottom conductive layer of power plane pair 414 while being electrically isolated from the other conductive layers of power plane pairs 412 and 414. Similarly, plated-through hole 420 provides connectivity to the top conductive layer of power plane pair 414 while being electrically isolated from the other conductive layers of power plane pairs 412 and 414. In addition, plated-through hole 422 provides connectivity to the top conductive layer of power plane pair 412 while being electrically isolated from the other conductive layers of power plane pairs 412 and 414.

Figure 4D:
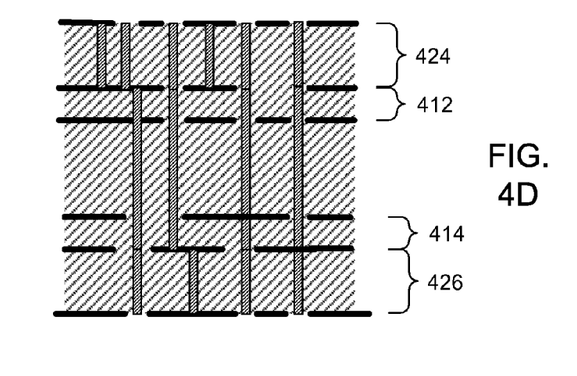
Figure 4E:
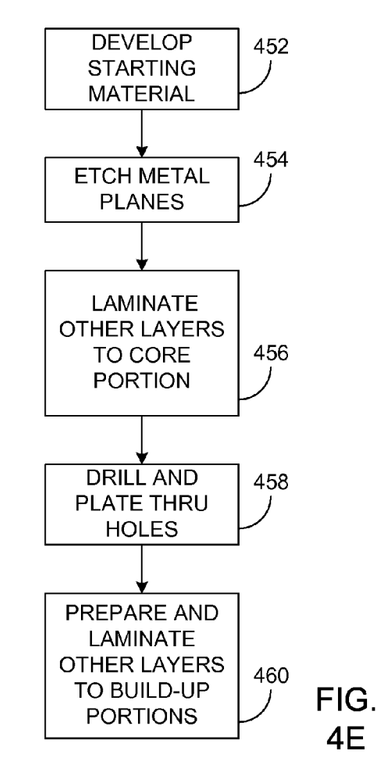

Previously developed conductive and insulative layers of build-up portions 312 and 314 may then be laminated to core 310, as in step 460, to form the package substrate having build-up layers 424 and 426 and associated interconnections. As illustrated in FIG. 4D, for example, power plane pairs 412 and 414 are each interconnected, using an assortment of plated-through holes and build-up vias, to the top and bottom surfaces of the package substrate to facilitate power signal propagation between the top and bottom surfaces of the package substrate. It is understood that while two build-up layers 424 and 426 are illustrated, any number of build-up layers may be similarly formed within the package substrate of FIG. 4D that are interconnected with other plated-through holes and build-up vias so as to facilitate the propagation of other signals between two or more conductive layers of the package substrate.

The resulting CCL implemented power plane pairs 412 and 414 within the package substrate of FIG. 4D exhibit an insulating layer having a thickness ranging between, e.g., 1-15 μm. Thus, the thickness of the dielectric layer of the CCL implemented power plane pairs is less than half of the insulating layer thicknesses of conventional power plane pairs, which range between 35-100 μm. As such, the spreading inductance and the distributed capacitance of the CCL implemented power distribution system of FIG. 4D combine to minimize the impedance of the power distribution system.

In a first embodiment, as illustrated in FIG. 3, power plane pairs 340,342 and 344,346 operate at different voltage magnitudes, whereby solder ball 332 and associated interconnects 352 may be utilized to provide the first voltage signal to power plane 340. In such an instance, a power supply (not shown) may be connected to solder ball 332 via a signal trace of a circuit board (not shown) to provide the operational power at a first voltage magnitude that may be required by die 302 during operation. Similarly, solder ball 334 and associated interconnects 354 may be utilized to provide the reference voltage magnitude, e.g., ground potential, to power plane 342 that may be required by die 302 during operation.

A second power supply may be similarly connected to solder balls 336 and 338 and associated interconnects 356 and 358, respectively, so as to provide the operational power at a second voltage magnitude and a second voltage reference magnitude to power plane pair 344 and 346, respectively, that may be required by die 302 during operation. In such an instance, power plane pairs 340,342 and 344,346 are electrically isolated from one another by associated interconnects 352-358.

In order to further increase the capacitance of the power distribution system of FIG. 3, capacitors 304 and 306 may be utilized to act as bypass, or decoupling, capacitors. In particular, capacitors 304 and 306 may serve as local energy storage devices that may respond to changing current demands of die 302. In other words, capacitors 304 and 306 are effective to substantially maintain the operating voltage delivered by power plane pairs 340,342 and 344,346 constant during the course of die 302 operation notwithstanding the transient current demands that are imposed by die 302. Capacitors 304 and 306 may be interconnected to power plane pairs 340,342 and 344,346 using build-up vias 316 within build-up portion 312 as illustrated.

Figure 5:
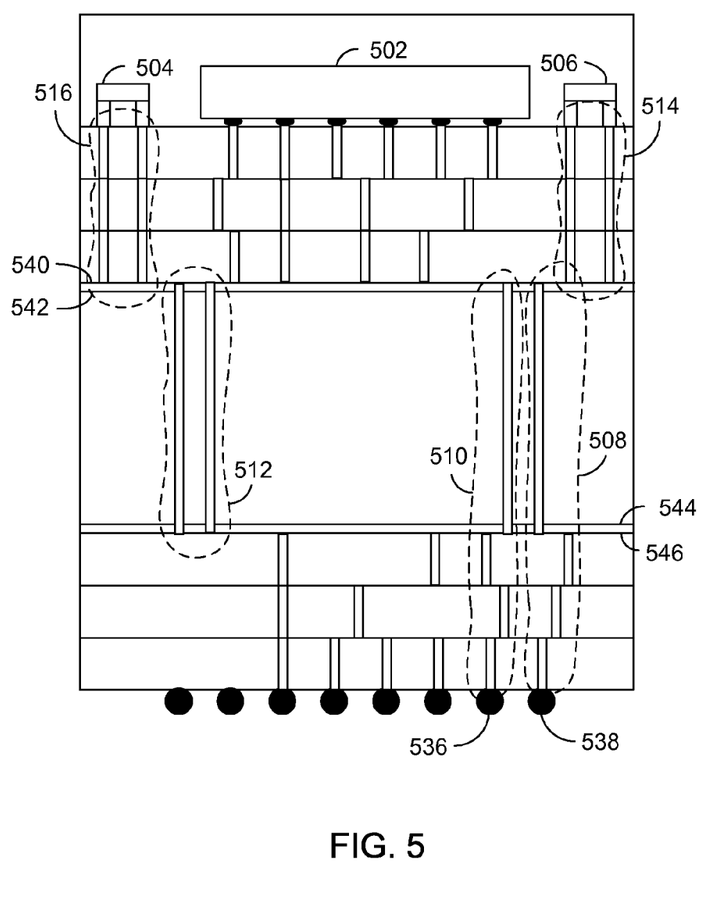
FIG. 5 illustrates an enhanced power distribution system within a semiconductor die package that exhibits reduced inductance and increased capacitance in accordance with an alternate embodiment of the present invention.

In an alternate embodiment, as illustrated in FIG. 5, power plane pairs 540,542 and 544,546 operate at the same voltage magnitude, whereby solder balls 538 and 536 receive the operational power at a first voltage magnitude and a first voltage magnitude reference, respectively. In such an instance, a power supply (not shown) may be connected to solder balls 538 and 536 via signal traces of a circuit board (not shown) to provide the operational power to power plane pairs 544,546, and 540,542 via interconnects 508-516, that may be required by die 502 during operation.

As such, a low-impedance loop is generated within the package substrate that extends from capacitor 506 to power plane pair 544,546 through associated build-up vias 514 and interconnects 508 and 510. The low-impedance loop then continues along power plane pair 544,546 through interconnect 512 to power plane pair 540,542 and to capacitor 504 through the build-up vias 516.

Interconnection of the two power planes as illustrated in FIG. 5, therefore, results in a decreased overall inductance of the power distribution system because the spreading inductance of power plane pairs 540,542 and 544,546 is effectively placed in parallel, which substantially halves the overall spreading inductance. In addition, the interconnection of the two power planes also results in an increased overall capacitance of the power distribution system because the distributed capacitance of power plane pairs 540,542 and 544,546 is effectively placed in parallel, which substantially doubles the overall distributed capacitance. As such, the overall impedance of the distribution system is substantially halved by the low-impedance loop implemented by the power distribution system of FIG. 5.

Figure 6A:
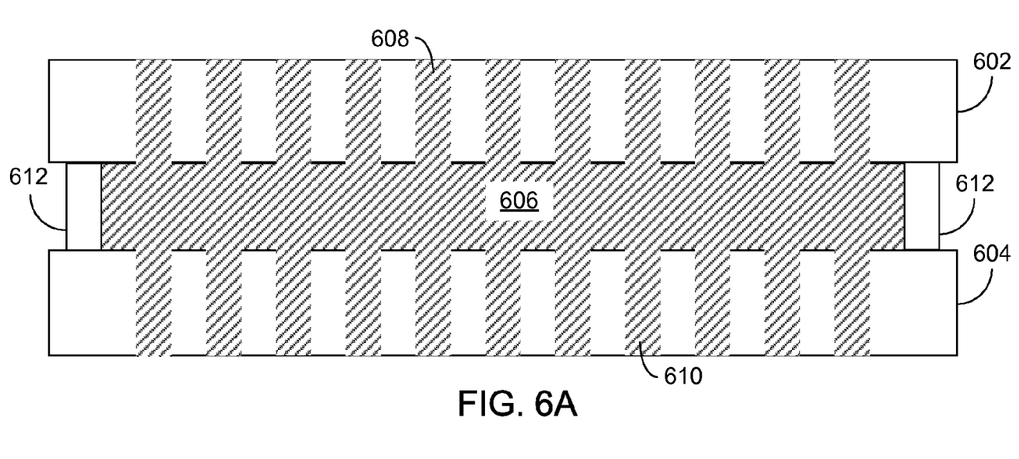
FIG. 6A illustrates a power plane pair that may be used in the power distribution systems of FIGS. 3-5 in accordance with an embodiment of the present invention.
Figure 6B:
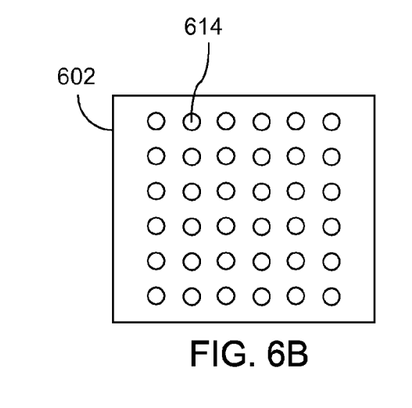
FIGS. 6B and 6C illustrate a perforation pattern of each conductive layer of the power plane pair of FIG. 6A in accordance with one embodiment of the present invention.
Figure 6C:
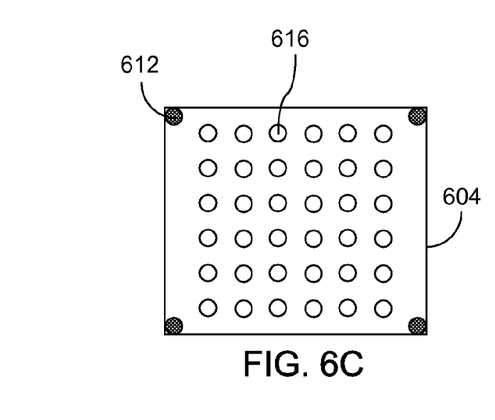

Turning to FIGS. 6A-6D, an alternate embodiment of a CCL implemented power plane pair is illustrated, whereby metallic plane 602 and/or 604 exhibit perforated mesh patterns, as illustrated in FIGS. 6B and 6C, respectively. Metallic planes 602 and 604 are then adjoined, as illustrated in FIG. 6A, and are separated by dielectric material 606. The separation distance of the two metallic planes is maintained by spacer posts 612, such that once metallic planes 602 and 604 are joined, a constant separation distance equal to the length of spacer posts 612 is maintained between metallic planes 602 and 604.

Figure 6D:
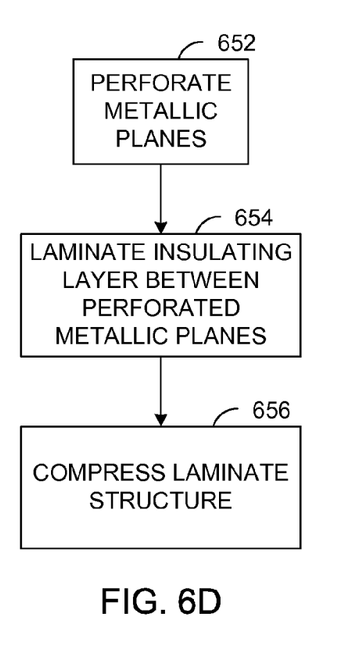
FIG. 6D illustrates a method of forming the power plane pair of FIG. 6A in accordance with one embodiment of the present invention.

A plurality of perforations may be formed within metallic plane 602 during step 652 of FIG. 6D, where the plurality of perforations 614 are arranged in accordance with the mesh pattern as illustrated in FIG. 6B. Similarly, a plurality of perforations 616 may be formed within metallic plane 604 during step 652 of FIG. 6D, where the plurality of perforations 616 are arranged in accordance with the mesh pattern as illustrated in FIG. 6C.

While the shape of perforations 614 and 616 is illustrated as being circular, perforations 614 and 616 may instead exhibit a plurality of shapes, e.g., rectangular, square, elliptical, hexagonal, octagonal, etc. In addition, while the mesh patterns of FIGS. 6B and 6C are illustrated as being square, the mesh patterns of FIGS. 6B and 6C may exhibit any pattern, e.g., star, diamond, rectangular, that may be required by a particular application. It is further noted that while perforated mesh patterns are illustrated to exist within both metallic plane 602 and 604, perforated mesh patterns may instead exist only in metallic plane 602, or only in metallic plane 604. Furthermore, the perforations in metallic plane 602 and/or 604 may not extend through the entire depth of the metallic plane, but rather may extend only partially, e.g., half-way through, the depth of the metallic plane.

Adjoining metallic plane 602 with metallic plane 604 as illustrated in FIG. 6A includes lamination step 654 of FIG. 6D, whereby dielectric material 606 is "sandwiched" between the two metallic planes to form a laminate structure. During compression step 656 of FIG. 6D, the original thickness, e.g., 35 μm, of the dielectric material is compressed to a final thickness of, e.g., 5 μm, through a combination of heat and pressure. Non-conductive spacer posts 612 define the final separation distance that exists between metallic planes 602 and 604 after the lamination step.

It is noted, that perforations 614 and/or 616 of metallic planes 602 and/or 604, respectively, allow dielectric material 606 to flow into metallic planes 602 and/or 604 during compression step 656. In particular, dielectric material 608 flows into perforations 614 and dielectric material 610 may optionally flow into perforations 616 (if any) during compression step 656 to facilitate the compression of dielectric material 606 to a final thickness of, e.g., 5 μm. As such, the final thickness of dielectric material 606 is less than one quarter of the dielectric layer thicknesses of conventional power plane pairs, which range between 35-100 μm.

In comparison with FIG. 4A, it can be seen that the power plane pair as illustrated in FIG. 6A does not exhibit a uniform area of communication between power plane 602 and power plane 604. Instead, an effective area of communication is established between power plane 602 and power plane 604 due to perforations 614 and/or 616, respectively. In one embodiment, the effective area of communication established between power plane 602 and power plane 604 may be approximately equal to 50% of the uniform area of communication that is established between power plane 402 and 404 of FIG. 4A. It is noted, therefore, that a 50% increase in spreading inductance and a 50% decrease in distributed capacitance may be expected due to the decrease in communication area between power plane pair 602,604, as compared to the spreading inductance and distributed capacitance provided by the uniform communication area of power plane pair 402,404.

In alternate embodiments, the CCL structure of FIG. 4A may be implemented by utilization of a variety of thin film fabrication techniques. In particular, thin films that form either of the metallic planes 402, 404 or the dielectric layer 406 may be thermally grown or deposited from the vapor phase. For example, a dielectric film may be deposited onto a metallic substrate through a chemical phase deposition (CPD) process, in which dielectric film 406 may be formed on metallic substrates 402,404 by the chemical reaction of vapor phase chemicals that contain the required constituents to form dielectric layer 406. Conversely, dielectric layer 406 may instead form the substrate, whereby conductive layers 402, 404 may be plated, or deposited, onto the dielectric substrate to form the CCL structure of FIG. 4A.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A power distribution system, comprising:
    a package substrate including,
        a plurality of conductive layers separated by a plurality of insulating layers, each of the plurality of insulating layers having a first thickness; and
        a plurality of copper-clad laminate structures, each copper-clad laminate structure including conductive layers separated by an insulating layer having a second thickness;
    a die coupled to the package substrate and adapted to conduct operational power from the plurality of copper-clad laminate structures; and
    wherein the second thickness is less than one half of the first thickness.

2. The power distribution system of claim 1, wherein the plurality of conductive layers and the plurality of insulative layers having the first thickness form build-up portions adjacent to the plurality of copper-clad laminate structures.

3. The power distribution system of claim 2, further comprising build-up vias displaced between the plurality of conductive layers of the build-up portions.

4. The power distribution system of claim 3, further comprising plated-through holes displaced between the plurality of conductive layers of the copper-clad laminate structures.

5. The power distribution system of claim 4, wherein the build-up vias and plated-through holes are interconnected to provide the operational power to the die.

6. The power distribution system of claim 5, wherein the interconnection of build-up vias and plated-through holes isolates one conductive layer of a copper-clad laminate structure from remaining conductive layers of the plurality of copper-clad laminate structures.

7. The power distribution system of claim 6, wherein the plurality of copper-clad laminate structures are adapted to conduct operational power at different voltage magnitudes.

8. The power distribution system of claim 5, wherein the interconnection of build-up vias and plated-through holes couple a first conductive layer of each copper-clad laminate structure together.

9. The power distribution system of claim 8, wherein the first conductive layer of each copper-clad laminate structure is adapted to conduct operational power at the same voltage magnitude.

10. The power distribution system of claim 1, wherein each conductive layer of the copper-clad laminate structure is deposited onto a substrate that forms the insulating layer of the copper-clad laminate structure.

11. The power distribution system of claim 1, wherein the insulating layer of the copper-clad laminate structure is deposited onto a substrate that forms a conductive layer of the copper-clad laminate structure.

12. A power distribution system, comprising:
a package substrate including,
 a plurality of conductive layers separated by a plurality of insulating layers, each of the plurality of insulating layers having a first thickness; and
 a plurality of copper-clad laminate structures, each copper-clad laminate structure including first and second conductive layers having first and second perforation patterns, the first and second conductive layers being separated by an insulating layer having a second thickness;
a die coupled to the package substrate and adapted to conduct operational power from the plurality of copper-clad laminate structures; and
wherein the second thickness is less than one quarter of the first thickness.

13. The power distribution system of claim 12, wherein the plurality of conductive layers and the plurality of insulative layers having the first thickness form build-up portions adjacent to the plurality of copper-clad laminate structures, the conductive layers of the build-up portions being selectively coupled together using build-up vias.

14. The power distribution system of claim 13, further comprising plated-through holes displaced between the first and second conductive layers of the copper-clad laminate structures, wherein the build-up vias and plated-through holes are interconnected to provide the operational power to the die.

15. The power distribution system of claim 12, wherein the first and second conductive layers of each copper-clad laminate structure are compressed together to reduce an initial thickness of the insulating layer of the copper-clad laminate structure to the second thickness.

16. The power distribution system of claim 15, wherein a portion of the insulating layer of each copper-clad laminate structure flows into the first and second perforation patterns during the reduction of the initial thickness of the insulating layer of each copper-clad laminate structure.

17. A method of forming a power distribution system within a package substrate, the method comprising:
developing a starting material to form power plane pairs within the package substrate, the starting material including first and second conductive layers separated by a first insulating layer;
laminating the power plane pairs together to form a core portion of the package substrate;
laminating build-up layers to the core portion to form build-up portions of the package substrate, the build-up portions including a plurality of conductive layers separated by a plurality of second insulating layers; and
wherein a thickness of the first insulating layer is less than half of a thickness of the plurality of second insulating layers.

18. The method of claim 17, wherein developing the starting material comprises:
selecting a pre-fabricated copper-clad laminate structure as the starting material; and
selecting the thickness of the first insulating layer to be between 1 and 15 micrometers.

19. The method of claim 17, wherein developing the starting material comprises:
perforating the first and second conductive layers;
laminating the first insulating layer between the first and second conductive layers to form a laminate structure; and
compressing the laminate structure until the thickness of the first insulating layer is less than a quarter of the thickness of the plurality of second insulating layers.

20. The method of claim 19, wherein a portion of the first insulating layer flows into the perforations formed within the first and second conductive layers during compression of the laminate structure.

* * * * *